(12) United States Patent
Zhang

(10) Patent No.: US 11,475,928 B2
(45) Date of Patent: *Oct. 18, 2022

(54) READ OPERATION CIRCUIT, SEMICONDUCTOR MEMORY, AND READ OPERATION METHOD

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/242,173

(22) Filed: Apr. 27, 2021

(65) Prior Publication Data

US 2021/0249055 A1  Aug. 12, 2021

Related U.S. Application Data

(63) Continuation of application No. PCT/CN2020/097403, filed on Jun. 22, 2020.

(30) Foreign Application Priority Data

Oct. 25, 2019  (CN) .......................... 201911021476.2

(51) Int. Cl.
  *G11C 7/10* (2006.01)
  *G11C 11/4091* (2006.01)
  *G11C 11/4097* (2006.01)

(52) U.S. Cl.
  CPC .......... *G11C 7/1048* (2013.01); *G11C 7/1006* (2013.01); *G11C 7/1015* (2013.01);
  (Continued)

(58) Field of Classification Search
  CPC ... G11C 7/1048; G11C 7/1015; G11C 7/1057; G11C 7/1084; G11C 7/1051; G11C 7/1006; G11C 11/4091; G11C 11/4097
  (Continued)

(56) References Cited

U.S. PATENT DOCUMENTS 6,456,545 B1   9/2002 Negishi
9,405,721 B2 *  8/2016 Ayyapureddi ...... G06F 13/4221
(Continued)

FOREIGN PATENT DOCUMENTS

CN      1838316 A    9/2006
CN    104425005 A    3/2015
(Continued)

OTHER PUBLICATIONS

Holdsworth Brain et al.,"Digital Logic Design Fourth edition", Jan. 1, 2002 (Jan. 1, 2002), total 4 pages, XP055876954.
(Continued)

*Primary Examiner* — Son L Mai
(74) *Attorney, Agent, or Firm* — Kilpatrick Townsend & Stockton, LLP

(57) ABSTRACT

Embodiments provide a read operation circuit, a semiconductor memory, and a read operation method. The read operation circuit includes: a DBI encoder configured to read read data from a memory bank, and determine whether to invert the read data according to the number of bits of high data in the read data to output global bus data for transmission through a global bus and DBI data for transmission through a DBI signal line, a DBI port being configured to receive the DBI data; a parallel-to-serial conversion circuit configured to perform parallel-to-serial conversion on the global bus data to generate output data of the DQ port; a data buffer module connected to the memory bank through the global bus; and a precharge module connected to a precharge (Continued)

signal line and configured to set an initial state of the global bus to Low.

12 Claims, 4 Drawing Sheets

(52) U.S. Cl.
CPC .......... *G11C 7/1051* (2013.01); *G11C 7/1057* (2013.01); *G11C 7/1084* (2013.01); *G11C 11/4091* (2013.01); *G11C 11/4097* (2013.01)

(58) Field of Classification Search
USPC ............................................ 365/203, 189.15
See application file for complete search history.

(56) References Cited

U.S. PATENT DOCUMENTS

| | | | | |
|---|---|---|---|---|
| 10,338,997 | B2* | 7/2019 | Dono | ................. G06F 11/1004 |
| 2010/0057971 | A1 | 3/2010 | Kao | |
| 2015/0363260 | A1 | 12/2015 | Hollis | |
| 2021/0247928 | A1* | 8/2021 | Zhang | ................. G11C 7/1006 |

FOREIGN PATENT DOCUMENTS

| | | |
|---|---|---|
| JP | S63253425 A | 10/1988 |
| KR | 20190119489 A | 10/2019 |

OTHER PUBLICATIONS

Mircea R Stan: "Bus-invert coding for low-power I/O", IEEE Transactions on Very Large Scale Integration (VLSI) Systems, IEEE Service Center, Piscataway, NJ, USA, vol. 3, No. 1, Mar. 1, 1995 (Mar. 1, 1995), total 10 pages.

Steinbach Bernd: "Recent Progress in the Boolean Domain", Sep. 25, 2013 (Sep. 25, 2013), total 16 pages, XP05587693.

European Patent Office, Extended European Search Report Issued in Application No. 20879865.2, dated Jan. 20, 2022, Germany, 11 pages.

\* cited by examiner

READ OPERATION CIRCUIT, SEMICONDUCTOR MEMORY, AND READ OPERATION METHOD

CROSS REFERENCE

This application is a continuation of PCT/CN2020/097403, filed on Jun. 22, 2020, which claims priority to Chinese Patent Application No. 201911021476.2, titled "READ OPERATION CIRCUIT, SEMICONDUCTOR MEMORY, AND READ OPERATION METHOD" and filed to the State Intellectual Property Office on Oct. 25, 2019, the entire contents of which are incorporated herein by reference.

TECHNICAL FIELD

The present disclosure relates to the field of semiconductor memory technologies, and more particularly, to a read operation circuit, a semiconductor memory, and a read operation method.

BACKGROUND

A semiconductor memory includes a static random-access memory (SRAM), a dynamic random access memory (DRAM), a synchronous dynamic random access memory (SDRAM), a read-only memory (ROM), and a flash memory, etc.

In a DRAM protocol of the Joint Electron Device Engineering Council (JEDEC), there are requirements for speed and power saving of the DRAM. How to ensure the DRAM to be more power-saving while ensuring the integrity of a signal and the reliability of data transmission and storage is a problem to be solved urgently in the industry.

SUMMARY

Embodiments of the present disclosure provide a read operation circuit, a semiconductor memory, and a read operation method to solve or alleviate one or more technical problems in the existing technologies.

In a first aspect, the embodiments of the present disclosure provide a read operation circuit used in a semiconductor memory, wherein the semiconductor memory comprises a Data Queue (DQ) port, a data bus inversion (DBI) port, and a memory bank. The read operation circuit comprising:

a DBI encoder connected to the memory bank, wherein the DBI encoder is configured to read data from the memory bank, and determine whether to invert the read data according to number of bits of high data in the read data to output global bus data for transmission through a global bus and DBI data for transmission through a DBI signal line, wherein the DBI port is configured to receive the DBI data;

a parallel-to-serial conversion circuit connected between the DQ port and the DBI encoder through the global bus and configured to perform parallel-to-serial conversion on the global bus data to generate output data of the DQ port;

a data buffer module connected to the memory bank through the global bus; and a precharge module connected to a precharge signal line and configured to set an initial state of the global bus to Low.

In one embodiment, the DBI encoder is configured to output inverted data of the read data as the global bus data and set the DBI data to High if the number of bits of the high data in the read data is greater than a preset value, and output original read data as the global bus data and set the DBI data to Low if the number of bits of the high data in the read data is less than or equal to the preset value.

In one embodiment, the M-bit DBI data is corresponding to the M groups of read data one to one, and the M-bit DBI data is corresponding to the M groups of global bus data one to one. The parallel-to-serial conversion circuit is also connected between the DBI encoder and the DQ port to output the M-bit DBI data processed by parallel-to-serial conversion to the DQ port, wherein the M is an integer greater than 1.

In one embodiment, each group of read data has N bits, the N being an integer greater than 1. The DBI encoder is configured to output inverted data of a group of read data inputted as a corresponding group of global bus data and set 1-bit DBI data corresponding to the group of read data inputted to High if the number of bits of high data in the group of read data inputted is greater than N/2, and output a group of read data inputted as a corresponding group of global bus data and set 1-bit DBI data corresponding to the group of read data inputted to Low if the number of bits of the high data in the group of read data inputted is less than or equal to N/2.

In one embodiment, the DBI encoder comprises:

a DBI encoder unit, an input terminal of the DBI encoder unit is connected to the memory bank, an output terminal of the DBI encoder unit being connected to the DBI signal line, and the DBI encoder unit is configured to set the DBI data to High if the number of bits of the high data in the read data is greater than a preset value, and set the DBI data to Low if the number of bits of the high data in the read data is less than or equal to the preset value; and a data selector, an input terminal of the data selector being connected to the DBI encoder unit to receive the read data through the DBI encoder unit, the input terminal of the data selector being configured to receive the DBI data through the DBI signal line, and an output terminal of the data selector being connected to the parallel-to-serial conversion circuit through the global bus. The data selector is configured to output inverted data of the read data as the global bus data if the DBI data is High, and output original read data as the global bus data if the DBI data is Low.

In one embodiment, the data selector comprises a plurality of data selection units, each of the plurality of data selection units comprising:

a first inverter, an input terminal of the first inverter being configured to receive the DBI data through the DBI signal line;

a second inverter, an input terminal of the second inverter being connected to the DBI encoder unit to receive the read data from the DBI encoder unit;

a first transmission gate, an input terminal of the first transmission gate being connected to an output terminal of the second inverter, an output terminal of the first transmission gate being connected to the global bus to output the global bus data, a negative control terminal of the first transmission gate being connected to an output terminal of the first inverter, and a positive control terminal of the first transmission gate being configured to receive the DBI data through the DBI signal line; and a second transmission gate, an input terminal of the second transmission gate being connected to the DBI encoder unit to receive the read data from the DBI encoder unit, an output terminal of the second transmission gate being connected to the global bus to output the global bus data, a negative control terminal of the second transmission gate being configured to receive the DBI data through the DBI signal line, and a positive control terminal of the second transmission gate is connected to the output terminal of the first inverter.

In one embodiment, the data selector comprises a plurality of data selection units, and each of the plurality of data selection units comprising:

a third inverter, an input terminal of the third inverter being configured to receive the DBI data through the DBI signal line;

a fourth inverter, an input terminal of the fourth inverter being connected to the DBI encoder unit to receive the read data from the DBI encoder unit;

a first logic AND gate, a first input terminal of the first logic AND gate being connected to the DBI encoder unit to receive the read data from the DBI encoder unit, and a second input terminal of the first logic AND gate being connected to an output terminal of the third inverter;

a second logic AND gate, a first input terminal of the second logic AND gate being configured to receive the DBI data through the DBI signal line, and a second input terminal of the second logic AND gate being connected to an output terminal of the fourth inverter; and a logic OR gate, two input terminals of the logic OR gate being respectively connected to an output terminal of the first logic AND gate and an output terminal of the second logic AND gate, and an output terminal of the logic OR gate being connected to the global bus to output the global bus data.

In one embodiment, the data buffer module comprises a plurality of PMOS transistors, wherein a gate of each of the plurality of PMOS transistors being connected to the memory bank, and a drain of each of the plurality of PMOS transistors being connected to the global bus. The precharge module comprises a plurality of NMOS transistors and a plurality of hold circuits, a gate of each of the plurality of NMOS transistors being connected to the precharge signal line, and a drain each of the plurality of NMOS transistors being connected to the global bus. An input terminal and an output terminal of each of the plurality of hold circuits being connected to the global bus.

In a second aspect, the embodiments of the present disclosure provide a semiconductor memory, comprising a DQ port, a DBI port, a memory bank, and any one of the read operation circuits mentioned above.

In a third aspect, the embodiments of the present disclosure provide a read operation method used in a semiconductor memory. The read operation method comprises:

setting an initial state of a global bus to Low;

reading read data from the memory bank;

determining whether to invert the read data according to the number of bits of high data in the read data to output global bus data for transmission through the global bus and DBI data for transmission through a DBI signal line; and performing parallel-to-serial conversion on the global bus data to generate output data of the DQ port.

In one embodiment, the determining whether to invert the read data according to the number of bits of high data in the read data to output global bus data for transmission through the global bus and DBI data for transmission through a DBI signal line comprises:

outputting inverted data of the read data as the global bus data and setting the DBI data to High if the number of bits of the high data in the read data is greater than a preset value; and outputting original read data as the global bus data and setting the DBI data to Low if the number of bits of the high data in the read data is less than or equal to the preset value.

In one embodiment, the determining whether to invert the read data according to the number of bits of high data in the read data to output global bus data for transmission through the global bus and DBI data for transmission through a DBI signal line comprises:

dividing the read data into M groups, wherein each group of read data has N bits, and both the M and the N being integers greater than 1;

outputting inverted data of a group of read data inputted as a corresponding group of global bus data and setting 1-bit DBI data corresponding to the group of read data inputted to High if the number of bits of high data in the group of read data inputted is greater than N/2; and outputting a group of read data inputted as a corresponding group of global bus data and setting 1-bit DBI data corresponding to the group of read data inputted to Low if the number of bits of the high data in the group of read data inputted is less than or equal to N/2.

According to the technical solutions of the embodiments of the present disclosure, more data "0" can be transmitted through a global bus having a precharge low architecture, such that the number of inversions of the internal global bus can be reduced. In this way, electric current is reduced significantly, and power consumption is decreased.

The above summary is for the purpose of illustration only and is not intended to be limiting in any way. In addition to the illustrative aspects, embodiments, and features described above, further aspects, embodiments, and features of the present disclosure will be readily apparent by reference to the drawings and the following detailed description.

BRIEF DESCRIPTION OF THE DRAWINGS

In the drawings, the same reference numerals denote the same or similar parts or elements throughout the several drawings unless otherwise specified. These drawings are not necessarily drawn to scale. It should be understood that these drawings depict only some embodiments disclosed according to the present disclosure and should not be deemed as limitations on the scope of the present disclosure.

FIG. 7-1 schematically illustrates a block diagram of a data selection unit according to an implementation manner of this embodiment;

FIG. 7-2 schematically illustrates a block diagram of the data selection unit according to another implementation manner of this embodiment.

REFERENCE NUMBERS IN THE ACCOMPANYING DRAWINGS

Figure 1:
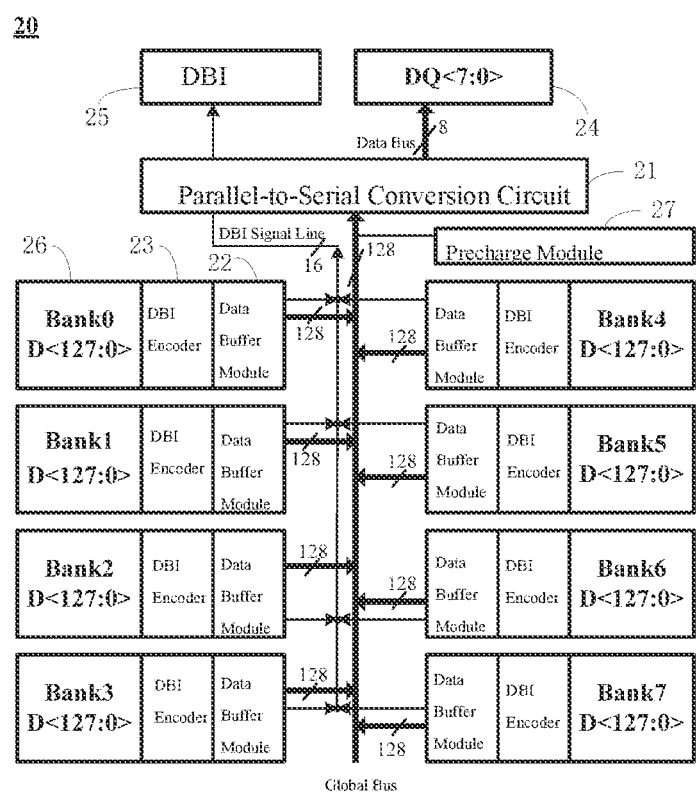
FIG. 1 schematically illustrates a block diagram of a partial structure of a semiconductor memory according to an implementation manner of this embodiment.

10: controller;
20: semiconductor memory;
21: parallel-to-serial conversion circuit;
22: data buffer module;
23: DBI encoder;
24: DQ port;
25: DBI port;
26: memory bank;
27: precharge module;
221: PMOS transistor;
222: NMOS transistor;
223: hold circuit;
231: DBI encoder unit;
232: data selector;
232': data selection unit;
232A: first inverter;
232B: second inverter;
232C: first transmission gate;
232D: second transmission gate;
232E: third inverter;
232F: fourth inverter;
232G: first logic AND gate;
232F: second logic AND gate; and
232K: logic OR gate.

DETAILED DESCRIPTION

The exemplary embodiment will now be described more fully with reference to the accompanying drawings. However, the exemplary embodiments can be implemented in a variety of forms and should not be construed as being limited to the embodiments set forth herein. Rather, these embodiments are provided such that the present disclosure will be thorough and complete and will fully convey the concepts of the exemplary embodiments to those skilled in the art. The same reference numerals in the drawings denote the same or similar parts, and thus repeated description thereof will be omitted.

FIG. 1 schematically illustrates a block diagram of a partial structure of a semiconductor memory according to an implementation manner of this embodiment. As shown in FIG. 1, the semiconductor memory 20 includes a DQ port 24, a data bus inversion (DBI) port 25, a memory bank 26, and a read operation circuit. The read operation circuit includes a global bus, a DBI signal line, a parallel-to-serial conversion circuit 21, a data buffer module 22, and a DBI encoder 23. In one embodiment, the semiconductor memory 20 is a dynamic random access memory (DRAM), such as a double data rate SDRAM 4 (abbreviated as DDR4).

In one example, as shown in FIG. 1, an active command can enable the only designated memory bank 26, and the read operation can only be performed on one memory bank 26. That is, when one memory bank among eight memory banks 26 (i.e. Bank<7:0>) is operating, the other memory banks are not operating. By means of the read operation circuit, the read data D<127:0> in the memory bank 26 outputs 8-bit output data DQ<7:0> through the DQ port 24. It is to be noted that the number of memory banks 26, the number of data bits of each memory bank 26, and the number of data bits of the DQ port 24 and the number of DQ ports 24 are not limited in this embodiment. For example, there may be one DQ port 24 configured to output 16-bit output data. There may also be two DQ ports 24, and each of the two DQ ports 24 is configured to output 8-bit output data.

Figure 2:
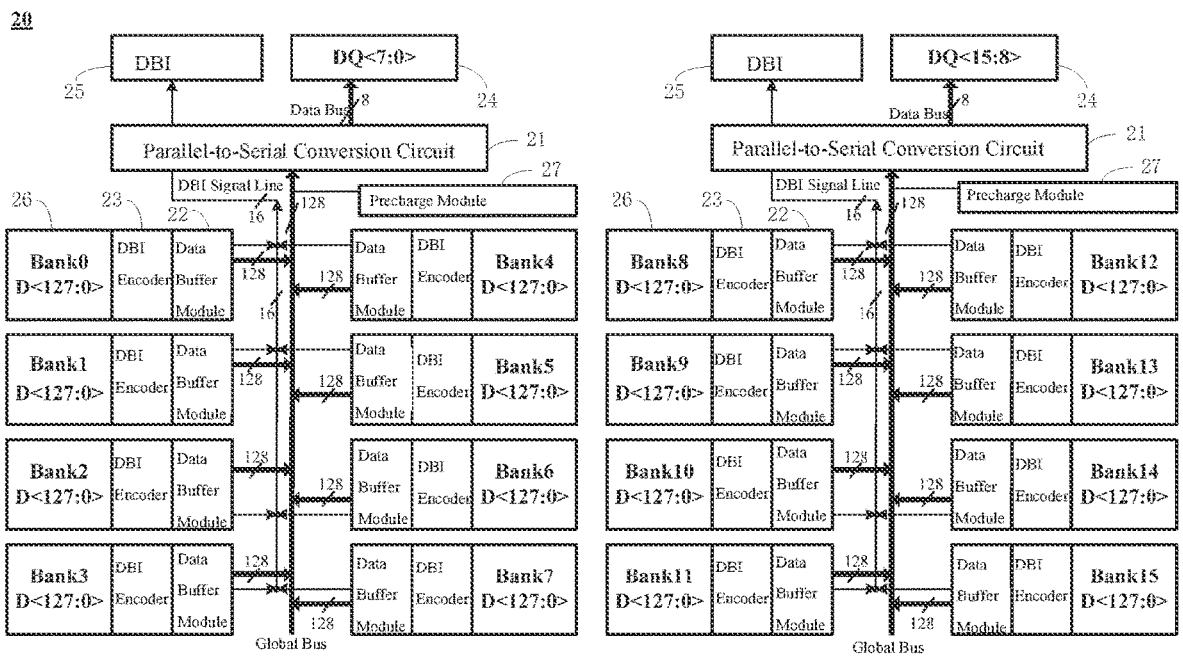
FIG. 2 schematically illustrates a block diagram of a partial structure of the semiconductor memory according to another implementation manner of this embodiment.

For example, as shown in FIG. 2, the output data DQ<7:0> is obtained by performing a read operation on a group of memory banks Bank<7:0> by one read operation circuit mentioned above, and the output data DQ<15:8> is obtained by performing a read operation on another group of memory banks Bank<15:8> by another read operation circuit mentioned above. Correspondingly, among eight memory banks 26 (i.e., Bank<15:8>) corresponding to the output data DQ<15:8>, when one memory bank is operating, the other memory banks are not operating.

The semiconductor memory 20 has an array structure, and each unit may have the same structure. However, because inputted data are different, data outputted by each unit may be different. The read operation circuit of this embodiment is introduced below by taking one of the memory banks as an example.

The DBI encoder 23 is connected to the memory bank 26 and is configured to read read data such as D<127:0> from the memory bank 26, and determine whether to invert the read data according to the number of bits of high data in the read data to output global bus data for transmission through a global bus and DBI data for transmission through a DBI signal line. High data may be data equal to "1", and low data may be data equal to "0". Inversion of data may be understood as inversion from "0" to "1", or inversion from "1" to "0". The inversion of a data line or a signal line may be understood as inversion from a high level to a low level, or inversion from a low level to a high level.

In one embodiment, the DBI encoder 23 is configured to output inverted data of the read data as the global bus data and set the DBI data to High if the number of bits of the high data in the read data is greater than a preset value, and output original read data as the global bus data and set the DBI data to Low if the number of bits of the high data in the read data is less than or equal to the preset value.

In one example, multi-bit read data is not grouped. That is, the DBI data may be 1-bit data, and the DBI data outputted by the DBI encoder 23 may be directly outputted to the DBI port 25 without passing through the parallel-to-serial conversion circuit 21. In one example, multi-bit read data may be grouped. For example, in one embodiment, the read data and the global bus data are both divided into M groups, the DBI data has M bits, the M-bit DBI data is corresponding to the M groups of read data one to one, and the M-bit DBI data is corresponding to the M groups of global bus data one to one. The parallel-to-serial conversion circuit 21 is also connected between the DBI encoder 23 and the DBI port 25 to output the M-bit DBI data processed by parallel-to-serial conversion to the DQ port, wherein the M is an integer greater than 1. It is to be noted that the parallel-to-serial conversion circuit 21 may include two parallel-to-serial conversion modules respectively configured to perform parallel-to-serial conversion on the global bus data and the DBI data, which is not limited in this embodiment.

Further, each group of read data may have N bits, wherein the N is an integer greater than 1. The DBI encoder 23 is configured to output inverted data of a group of read data inputted as a corresponding group of global bus data and set 1-bit DBI data corresponding to the group of read data inputted to High if the number of bits of high data in the group of read data inputted is greater than N/2, and output a group of read data inputted as a corresponding group of global bus data and set 1-bit DBI data corresponding to the group of read data inputted to Low if the number of bits of the high data in the group of read data inputted is less than or equal to N/2.

For example, the read data D<127:0> is divided into 16 groups, each group of read data has 8 bits, and each group of read data is corresponding to 1-bit DBI data. Correspondingly, the DBI data has 16 bits, such as DBI<15:0>. The global bus data D1'<127:0> will also be divided into 16 groups accordingly. Each 1-bit DBI data is corresponding to a group of global bus data. For a group of read data D<127:120>, if the number of bits equal to "1" in D<127:120> is greater than 4 bits, the corresponding DBI<15>=1, and a group of global bus data D'<120:127> outputted is equal to the inverted data of D<127:120>; and if the number of bits equal to "1" in the read data is less than or equal to 4 bits, the corresponding DBI<15>=0, and a group of global bus data D'<120:127> outputted is D<127:120>.

Hence, when DBI<15>=1, the global bus data D'<127:120> outputted from the DBI encoder 23 is the inverted data of the read data D<127:120> of the memory bank 26 (such as Bank0). When DBI<15>=0, the global bus data D'<127:120> outputted from the DBI encoder 23 is the read data D<127:120> of the memory bank 26 (such as Bank0). That is, the read data D'<127:120>=D<127:120>. Similarly, when DBI<1>=1, the global bus data D'<15:8> outputted from the DBI encoder 23 is the inverted data of the read data D<15:8> of the memory bank 26 (such as Bank0). When DBI<1>=0, the global bus data D'<15:8> outputted from the DBI encoder 23 is the read data D<15:8> of the memory bank 26 (such as Bank0). That is, the global bus data D'<15:8>=D<15:8>. When DBI<0>=1, the global bus data D'<7:0> outputted from the DBI encoder 23 is the inverted data of the read data D<7:0> of the memory bank 26 (such as Bank0). When the DBI<0>=0, the global bus data D'<7:0> outputted from the DBI encoder 23 is the read data D<7:0> of the memory bank 26 (such as Bank0). That is, the global bus data D'<7:0>=D<7:0>.

In one example, there are a plurality of global buses, which are divided into M (M is an integer greater than 1) groups, wherein each of the plurality of global buses transmits 1-bit global bus data. For example, there are 128 global buses, which are divided into 16 groups. The global bus <0> transmits global bus data D'<0>; the global bus <1> transmits global bus data D'<1>; . . . ; and the global bus <127> transmits global bus data D'<127>.

In one example, there are 16 DBI signal lines, and each DBI signal line transmits 1-bit DBI data. For example, the DBI signal line <0> transmits DBI data DBI<0>, and is corresponding to the global bus data D'<7:0> to manifest whether D'<7:0> is the inverted data. the DBI signal line <1> transmits DBI data DBI<1>, and is corresponding to the global bus data D'<15:8> to manifest whether D'<15:8> is the inverted data; . . . ; and the DBI signal line <15> transmits DBI data DBI<15>, and is corresponding to the global bus data D'<127:120> to manifest whether D'<127:120> is the inverted data.

The parallel-to-serial conversion circuit 21 is connected between the DQ port 24 and the DBI encoder 23 through the global bus and is configured to perform parallel-to-serial conversion on the global bus data to generate output data of the DQ port 24. For example, the parallel-to-serial conversion circuit 21 performs parallel-to-serial conversion on 128-bit global bus data D'<127:0> corresponding to Bank 0 to generate 8-bit output data DQ<7:0>, and transmits the output data DQ<7:0> to the DQ port 24 through a data bus.

Thus, there are more data "0" among the global bus data D'<127:0> transmitted through the global bus. Accordingly, in the semiconductor memory 20 as shown in FIG. 2, there are more data "0" among the 256-bit global bus data (including the 128-bit global bus data corresponding to DQ<7:0> and the 128-bit global bus data corresponding to DQ<15:8>).

The data buffer module 22 is connected to the memory bank 26 through the global bus, and the precharge module 27 is connected to a precharge signal line and is configured to set an initial state of the global bus to Low. That is, in this embodiment, the semiconductor memory 20 uses a precharge low global bus transmission structure.

Figure 3:
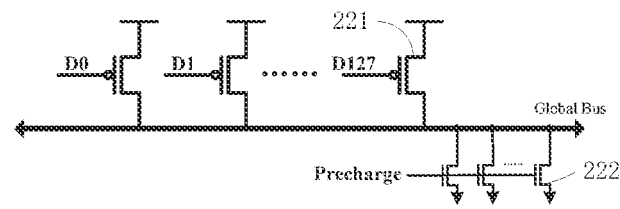
FIG. 3 schematically illustrates a circuit diagram (corresponding to one memory bank) of a data buffer module according to an implementation manner of this embodiment.
Figure 4:
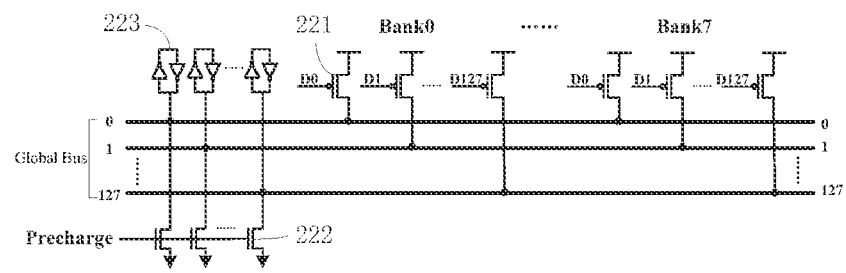
FIG. 4 schematically illustrates a circuit diagram (corresponding to a plurality of memory banks) of the data buffer module according to an implementation manner of this embodiment.

FIG. 3 schematically illustrates a circuit diagram (corresponding to one memory bank 26) of the data buffer module 22 and the precharge module 27 according to an implementation manner of this embodiment. FIG. 4 schematically illustrates a circuit diagram (corresponding to eight memory banks 26) of the data buffer module 22 and the precharge module 27 according to an implementation manner of this embodiment.

As shown in FIG. 3 and FIG. 4, the data buffer module 22 includes a plurality of positive channel metal oxide semiconductor (PMOS) transistors 221, and the precharge module 27 includes a plurality of negative channel metal oxide semiconductor (NMOS) transistors 222 and a plurality of hold circuits 223. A gate of each of the plurality of PMOS transistors 221 is connected to the memory bank 26, and a drain of each of the plurality of PMOS transistors 221 is connected to the global bus. A gate of each of the plurality of NMOS transistors 222 is connected to the precharge signal line, and a drain of each of the plurality of NMOS transistors 222 is connected to the global bus. An input terminal and an output terminal of each of the plurality of hold circuits 223 are connected to the global bus to form a positive feedback circuit.

The precharge signal line is configured to set the initial state of each global bus to Low. In this process, a pull-down pulse (about 2 ns) is generated by the precharge signal line to pull down a certain global bus for a moment, and the hold circuit 223 forms a positive feedback and latches this global bus at a low level. However, the hold circuit 223 has weaker ability in pulling up and pulling down electric current. When a certain global bus needs to be inverted to a high level, a data line (i.e., a data line connected to the gate of the corresponding PMOS transistor 221) corresponding to this global bus is pulled down (also a pulse about 2 ns), such that the PMOS transistor 221 pulls up this global bus for a moment (the pull-up ability is better than the pull-down ability of the hold circuit 223). Next, this global bus is latched to a high level through the positive feedback. In this way, inversion of the data line is completed. There are more data "0" among the global bus data D'<127:0>, and thus fewer inversions are required. Therefore, the IDD4R (read current) of the semiconductor memory will be reduced, such that the power consumption of the semiconductor memory can be reduced.

Figure 5:
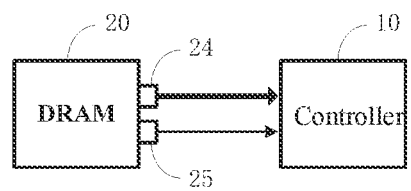
FIG. 5 schematically illustrates a schematic diagram of a DBI function.

Functions of the DBI port 25 are introduced below with reference to FIG. 5. Data outputted from the semiconductor memory 20 include the DBI data of the DBI port 25 and the output data of the DQ port 24. When the DBI data of the DBI port 25 is equal to 1, the output data such as DQ<7:0> needs to be inverted, and the inverted data is outputted to a controller 10. When the DBI data of the DBI port 25 is equal to 0, the original output data may be directly transmitted to the controller 10. An On-Die Termination (ODT) of the semiconductor memory 20 can absorb the electric current of the DQ port 24 to prevent a signal from forming reflection on an internal circuit of the semiconductor memory 20. During the operation of the semiconductor memory 20, a magnitude of the ODT is adjusted to match the controller 10. In one example, the ODT has a precharge low structure. When the data of the DQ port 24 is "1" (i.e., high data), there is larger leakage current flowing through the ODT, which may increase power consumption. In this embodiment, there are more data "0" among the output data of the DQ port 24, and thus the power consumption of the semiconductor memory can be further decreased.

In the related technologies, in the case that the DBI function is enabled, when the semiconductor memory is performing a read operation, a module configured to invert and encode data is arranged at a position where the data is about to be outputted from the semiconductor memory, i.e., arranged behind the parallel-to-serial conversion module. Therefore, in the related technologies, there are more data "1" transmitted through the internal global bus of the semiconductor memory, which may cause larger IDD4R and higher power consumption.

According to the semiconductor memory 20 of this embodiment, in the process of reading data from the semiconductor memory 20, when the global bus data has 256 bits, if it is needed to invert the 256-bit global bus data, it is only needed to invert 32-bit DBI data, such that the IDD4R electric current will be reduced significantly.

Figure 6:
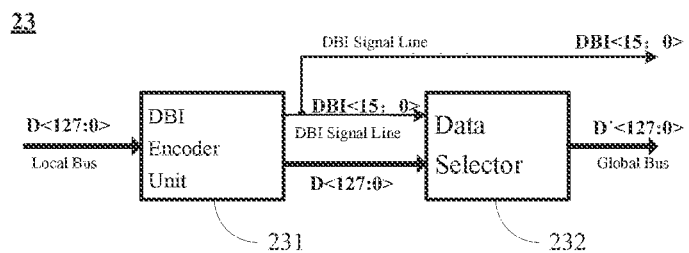
FIG. 6 schematically illustrates a block diagram of a DBI encoder according to an implementation manner of this embodiment.

In one embodiment, as shown in FIG. 6, the DBI encoder 23 includes a DBI encoder unit 231 and a data selector 232.

An input terminal of the DBI encoder unit 231 is connected to the memory bank 26 through a local bus, and an output terminal of the DBI encoder unit 231 is connected to the DBI signal line and is connected to an input terminal of the data selector 232. The DBI encoder unit 231 is configured to set the DBI data to High if the number of bits of the high data in the read data is greater than a preset value, and set the DBI data to Low if the number of bits of the high data in the read data is less than or equal to the preset value.

In one example, the DBI encoder unit 231 may include a plurality of DBI encoder subunits, and each of the plurality of DBI encoder subunits is configured to process a group of read data, and then output 1-bit DBI data. For example, the data selection unit may have 16 DBI encoder subunits, which are respectively corresponding to 16 groups of read data, and then 16-bit DBI data is outputted, wherein each group of read data may have 8 bits.

An input terminal of the data selector 232 is connected to the DBI encoder unit 231 to receive the read data through the DBI encoder unit 231, the input terminal of the data selector 232 is configured to receive the DBI data through the DBI signal line, and an output terminal of the data selector 232 is connected to the parallel-to-serial conversion circuit 21 through the global bus. The data selector 232 is configured to output inverted data of the read data as the global bus data if the DBI data is High, and output original read data as the global bus data if the DBI data is Low.

In one embodiment, the data selector 232 includes a plurality of data selection units 232', and each of the plurality of data selection units 232' is configured to process 1-bit DBI data and a group of read data. For example, there may be 16 data selection units 232', which are respectively corresponding to 16 groups of read data and 1-bit DBI data, wherein each group of read data has 8 bits.

Figures 1, 7:
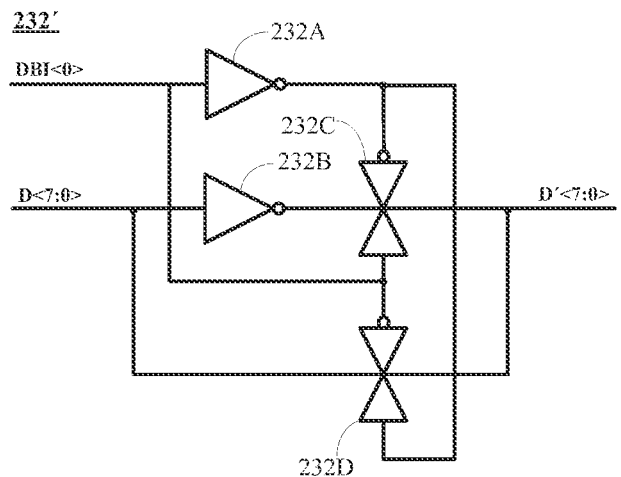
Figures 2, 7:
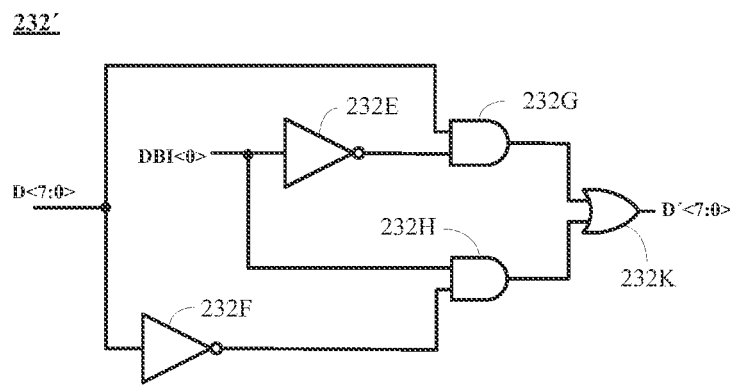

FIG. 7-1 and FIG. 7-2 illustrate two different implementation manners of the data selection unit 232'.

As shown in FIG. 7-1, the data selection unit 232' includes a first inverter 232A, a second inverter 232B, a first transmission gate 232C, and a second transmission gate 232D. An input terminal of the first inverter 232A is configured to receive the DBI data through the DBI signal line. An input terminal of the second inverter 232B is connected to the DBI encoder unit 231 to receive the read data from the DBI encoder unit 231. An input terminal of the first transmission gate 232C is connected to an output terminal of the second inverter 232B, an output terminal of the first transmission gate 232C is connected to the global bus to output the global bus data, a negative control terminal (the upper control terminal in FIG. 7-1) of the first transmission gate 232C is connected to an output terminal of the first inverter 232A, and a positive control terminal (the lower control terminal in FIG. 7-1) of the first transmission gate 232C is configured to receive the DBI data through the DBI signal line. An input terminal of the second transmission gate 232D is connected to the DBI encoder unit 231 to receive the read data from the DBI encoder unit 231, an output terminal of the second transmission gate 232D is connected to the global bus to output the global bus data, a negative control terminal of the second transmission gate 232D is configured to receive the DBI data through the DBI signal line, and a positive control terminal of the second transmission gate 232D is connected to the output terminal of the first inverter 232A.

Taking DBI<0> and the read data D<7:0> as an example, as shown in FIG. 7-1, when DBI=1, the global bus data D'<7:0> is the inverted data of the read data D<7:0>; and when DBI=0, the global bus data D'<7:0> is the read data D<7:0>.

It is to be noted that a group of second inverter 232B, first transmission gate 232C and second transmission gate 232D is configured to process 1-bit read data and output 1-bit corresponding global bus data. That is, corresponding to 8-bit read data D<7:0>, there should be eight groups of second inverters 232B, first transmission gates 232C and second transmission gates 232D, and then 8-bit global bus data D<7:0> is outputted.

As shown in FIG. 7-2, the data selection unit 232' includes a third inverter 232E, a fourth inverter 232F, a first logic AND gate 232G, a second logic AND gate 232H, and a logic OR gate 232K. An input terminal of the third inverter 232E is configured to receive the DBI data through the DBI signal line. An input terminal of the fourth inverter 232F is connected to the DBI encoder unit 231 to receive the read data from the DBI encoder unit 231. A first input terminal of the first logic AND gate 232G is connected to the DBI encoder unit 231 to receive the read data from the DBI encoder unit 231, and a second input terminal of the first logic AND gate 232G is connected to an output terminal of the third inverter 232E. A first input terminal of the second logic AND gate 232H is configured to receive the DBI data through the DBI signal line, and a second input terminal of the second logic AND gate 232H is connected to an output terminal of the fourth inverter 232F. Two input terminals of the logic OR gate 232K are respectively connected to an output terminal of the first logic AND gate 232G and an output terminal of the second logic AND gate 232H, and an output terminal of the logic OR gate 232K is connected to the global bus to output the global bus data.

Taking DBI<0> and the read data D<7:0> as an example, as shown in FIG. 7-2, when DBI=1, the global bus data D'<7:0> is the inverted data of the read data D<7:0>; and when DBI=0, the global bus data D'<7:0> is the read data D<7:0>.

It is to be noted that a group of fourth inverter 232F, first logic AND gate 232G, second logic AND gate 232H and logic OR gate 232K is configured to process 1-bit read data to output 1-bit corresponding global bus data. That is, corresponding to 8-bit read data D<7:0>, there should be eight groups of third inverters 232E, fourth inverters 232F, first logic AND gates 232G second logic AND gates 232H and logic OR gates 232K, and then 8-bit global bus data D<7:0> is outputted.

In practical applications, the semiconductor memory 20 of this embodiment also includes other structures such as a sense amplifier and a precharge circuit, which are not repeated in this embodiment because they belong to the existing technologies.

Figure 8:
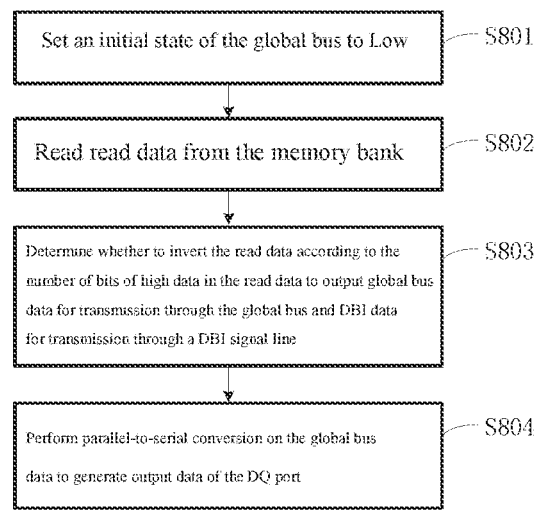
FIG. 8 schematically illustrates a flowchart of a read operation method according to an implementation manner of this embodiment.

FIG. 8 schematically illustrates a flowchart of a read operation method according to an implementation manner of this embodiment. The read operation method may be used in the semiconductor memory 20. As shown in FIG. 8, the read operation method may include:

Step S801: setting an initial state of a global bus to Low;

Step S802: reading read data from the memory bank;

Step S803: determining whether to invert the read data according to the number of bits of high data in the read data to output global bus data for transmission through the global bus and DBI data for transmission through a DBI signal line; and Step S804: performing parallel-to-serial conversion on the global bus data to generate output data of the DQ port.

In one embodiment, the Step S803 may include: outputting inverted data of the read data as the global bus data and setting the DBI data to High if the number of bits of the high data in the read data is greater than a preset value; and outputting original read data as the global bus data and setting the DBI data to Low if the number of bits of the high data in the read data is less than or equal to the preset value.

In one embodiment, the Step S803 may include: dividing the read data into M groups, wherein each group of read data has N bits, and both the M and the N are integers greater than 1; outputting inverted data of a group of read data inputted as a corresponding group of global bus data and setting 1-bit DBI data corresponding to the group of read data inputted to High if the number of bits of high data in the group of read data inputted is greater than N/2; and outputting a group of read data inputted as a corresponding group of global bus data and setting 1-bit DBI data corresponding to the group of read data inputted to Low if the number of bits of the high data in the group of read data inputted is less than or equal to N/2.

The read operation circuit provided by the embodiments of the present disclosure is used in a semiconductor memory whose global bus transmission structure is a precharge low architecture. By arranging the DBI encoder between the parallel-to-serial conversion circuit and the memory bank, more data "0" can be transmitted through the global bus, such that the number of inversions of the internal global bus can be reduced. In this way, electric current may be reduced significantly, and power consumption may be decreased.

Reference throughout this specification to the terms "one embodiment," "some embodiments," "one example," "an example," or "some examples," means that a feature, structure, material, or characteristic described in connection with the embodiment or example is included in at least one embodiment or example of the present disclosure. Furthermore, the features, structures, materials, or characteristics described may be combined in any suitable manner in one or more embodiments or examples. In addition, without contradiction, those skilled in the art may combine different embodiments or examples described in the specification and features of different embodiments or examples.

In addition, the features, structures, or characteristics described may be combined in one or more embodiments in any suitable manner. However, those skilled in the art will appreciate that one or more of the details may be practiced without practicing the technical solutions of the present disclosure, and other methods, components, materials, devices, steps, and the like may be employed. In other instances, well-known structures, methods, devices, implementations, materials, or operations are not shown or described in detail to avoid obscuring aspects of the present disclosure.

Terms "first" and "second" are used only for purposes of description and are not intended to indicate or imply relative importance or to imply the number of indicated technical features. Thus, the feature defined with "first" and "second" may explicitly or implicitly include at least one such feature. In the description of the present disclosure, "a plurality of" refers to at least two, unless otherwise expressly specified.

It is to be noted that, steps of the method in the present disclosure are described in a particular order in the accompanying drawings. However, this does not require or imply to execute these steps necessarily according to the particular order, or this does not mean that the expected result cannot be implemented unless all the shown steps are executed. Additionally or alternatively, some steps may be omitted, a plurality of steps may be combined into one step for execution, and/or one step may be decomposed into a plurality of steps for execution. Moreover, the above accompanying drawings are merely illustrative description of processes included in the method according to the exemplary embodiments of the present disclosure and are not intended to limit the present disclosure. It is easy to understand that the processes shown in the above accompanying drawings do not indicate or limit time sequences of these processes. Furthermore, it is also easy to understand that these processes may be executed, for example, synchronously or asynchronously in a plurality of modules.

In addition, although the spirit and the principle of the present disclosure have been described with reference to several embodiments, it should be understood that the present disclosure is not limited to these embodiments disclosed, and the division of various aspects does not mean that the features in these aspects cannot be combined to get benefits, and this division is only for ease of expression. The present disclosure is intended to cover various modifications and equivalent arrangements included within the spirit and scope of the appended claims.

The above-mentioned embodiments are merely embodiments of the present disclosure, but the protection scope of the present disclosure is not limited thereto. Any variation or substitution easily conceivable to a person of ordinary skills in the art within the technical scope disclosed in the present disclosure shall fall into the protection scope of the present disclosure. Therefore, the protection scope of the present disclosure shall be subject to the protection scope of the claims.

What is claimed is:

1. A read operation circuit used in a semiconductor memory, wherein the semiconductor memory comprises a Data Queue (DQ) port, a data bus inversion (DBI) port, and a memory bank, the read operation circuit comprising:

a DBI encoder connected to the memory bank, wherein the DBI encoder is configured to read data from the memory bank, and determine whether to invert the read data according to number of bits of high data in the read data to output global bus data for transmission through a global bus and DBI data for transmission through a DBI signal line, wherein the DBI port is configured to receive the DBI data;

a parallel-to-serial conversion circuit connected between the DQ port and the DBI encoder through the global bus and configured to perform parallel-to-serial conversion on the global bus data to generate output data of the DQ port;

a data buffer module connected to the memory bank through the global bus; and a precharge module connected to a precharge signal line and configured to set an initial state of the global bus to Low.

2. The read operation circuit according to claim 1, wherein the DBI encoder is configured to output inverted data of the read data as the global bus data and set the DBI data to High if number of bits of the high data in the read data is greater than a preset value, and output original read data as the global bus data and set the DBI data to Low if the number of bits of the high data in the read data is less than or equal to the preset value.

3. The read operation circuit according to claim 1, wherein the read data and the global bus data are both divided into M groups, the DBI data having M bits corresponding to the M groups of global bus data one to one, and to the M groups of global bus data one to one;

wherein the parallel-to-serial conversion circuit is further connected between the DBI encoder and the DQ port to output the M-bits DBI data processed by parallel-to-serial conversion to the DQ port, wherein the M is an integer greater than 1.

4. The read operation circuit according to claim 3, wherein each group of read data has N bits, the N being an integer greater than 1;

wherein the DBI encoder is configured to output inverted data of a group of read data inputted as a corresponding group of global bus data and set 1-bit DBI data corresponding to the group of read data inputted to High if number of bits of high data in the group of read data inputted is greater than N/2, and output a group of read data inputted as a corresponding group of global bus data and set 1-bit DBI data corresponding to the group of read data inputted to Low if number of bits of the high data in the group of read data inputted is less than or equal to N/2.

5. The read operation circuit according to claim 1, wherein the DBI encoder comprises:

a DBI encoder unit, an input terminal of the DBI encoder unit being connected to the memory bank, an output terminal of the DBI encoder unit being connected to the DBI signal line, wherein the DBI encoder unit is configured to set the DBI data to High if the number of bits of the high data in the read data is greater than a preset value, and set the DBI data to Low if the number of bits of the high data in the read data is less than or equal to the preset value; and a data selector, an input terminal of the data selector being connected to the DBI encoder unit to receive the read data through the DBI encoder unit, and the input terminal of the data selector being further configured to receive the DBI data through the DBI signal line, and an output terminal of the data selector being connected to the parallel-to-serial conversion circuit through the global bus, wherein the data selector is configured to output inverted data of the read data as the global bus data if the DBI data is High, and output original read data as the global bus data if the DBI data is Low.

6. The read operation circuit according to claim 5, wherein the data selector comprises a plurality of data selection units, each of the plurality of data selection units comprising:

a first inverter, an input terminal of the first inverter being configured to receive the DBI data through the DBI signal line;

a second inverter, an input terminal of the second inverter being connected to the DBI encoder unit to receive the read data from the DBI encoder unit;

a first transmission gate, an input terminal of the first transmission gate being connected to an output terminal of the second inverter, an output terminal of the first transmission gate being connected to the global bus to output the global bus data, a negative control terminal of the first transmission gate being connected to an output terminal of the first inverter, and a positive control terminal of the first transmission gate being configured to receive the DBI data through the DBI signal line; and a second transmission gate, an input terminal of the second transmission gate being connected to the DBI encoder unit to receive the read data from the DBI encoder unit, an output terminal of the second transmission gate being connected to the global bus to output the global bus data, a negative control terminal of the second transmission gate being configured to receive the DBI data through the DBI signal line, and a positive control terminal of the second transmission gate being connected to the output terminal of the first inverter.

7. The read operation circuit according to claim 5, wherein the data selector comprises a plurality of data selection units, each of the plurality of data selection units comprising:

a third inverter, an input terminal of the third inverter being configured to receive the DBI data through the DBI signal line;

a fourth inverter, an input terminal of the fourth inverter being connected to the DBI encoder unit to receive the read data from the DBI encoder unit;

a first logic AND gate, a first input terminal of the first logic AND gate being connected to the DBI encoder unit to receive the read data from the DBI encoder unit, and a second input terminal of the first logic AND gate being connected to an output terminal of the third inverter;

a second logic AND gate, a first input terminal of the second logic AND gate being configured to receive the DBI data through the DBI signal line, and a second input terminal of the second logic AND gate being connected to an output terminal of the fourth inverter; and a logic OR gate, two input terminals of the logic OR gate being respectively connected to an output terminal of the first logic AND gate and an output terminal of the second logic AND gate, and an output terminal of the logic OR gate being connected to the global bus to output the global bus data.

8. The read operation circuit according to claim 1, wherein the data buffer module comprises a plurality of PMOS transistors, a gate of each of the plurality of PMOS transistors being connected to the memory bank, a drain of each of the plurality of PMOS transistors being connected to the global bus; and wherein the precharge module comprises a plurality of NMOS transistors and a plurality of hold circuits, a gate of each of the plurality of NMOS transistors being connected to the precharge signal line, a drain of each of the plurality of NMOS transistors being connected to the global bus, and an input terminal and an output terminal of each of the plurality of hold circuits being connected to the global bus.

9. A semiconductor memory, comprising a Data Queue (DQ) port, a data bus inversion (DBI) port, a memory bank, and a read operation circuit, wherein the read operation circuit comprising:
   a DBI encoder connected to the memory bank, wherein the DBI encoder is configured to read read data from the memory bank, and determine whether to invert the read data according to a number of bits of high data in the read data to output global bus data for transmission through a global bus and DBI data for transmission through a DBI signal line; wherein the DBI port is configured to receive the DBI data;
   a parallel-to-serial conversion circuit connected between the DQ port and the DBI encoder through the global bus and configured to perform parallel-to-serial conversion on the global bus data to generate output data of the DQ port;
   a data buffer module connected to the memory bank through the global bus; and
   a precharge module connected to a precharge signal line and configured to set an initial state of the global bus to Low.

10. A read operation method used in a semiconductor memory, comprising:
   setting an initial state of a global bus to Low;
   reading read data from a memory bank;
   determining whether to invert the read data according to number of bits of high data in the read data to output global bus data for transmission through the global bus and data bus inversion (DBI) data for transmission through a DBI signal line; and
   performing parallel-to-serial conversion on the global bus data to generate output data of a Data Queue (DQ) port.

11. The read operation method according to claim 10, wherein the determining whether to invert the read data according to the number of bits of high data in the read data to output global bus data for transmission through the global bus and DBI data for transmission through a DBI signal line comprises:
   outputting inverted data of the read data as the global bus data and setting the DBI data to High if the number of bits of the high data in the read data is greater than a preset value; and
   outputting original read data as the global bus data and setting the DBI data to Low if the number of bits of the high data in the read data is less than or equal to the preset value.

12. The read operation method according to claim 10, wherein the determining whether to invert the read data according to the number of bits of high data in the read data to output global bus data for transmission through the global bus and DBI data for transmission through a DBI signal line comprises:
   dividing the read data into M groups, wherein each group of read data has N bits, both the M and the N being integers greater than 1;
   outputting inverted data of a group of read data inputted as a corresponding group of global bus data and setting 1-bit DBI data corresponding to the group of read data inputted to High if the number of bits of high data in the group of read data inputted is greater than N/2; and
   outputting a group of read data inputted as a corresponding group of global bus data and setting 1-bit DBI data corresponding to the group of read data inputted to Low if number of bits of the high data in the group of read data inputted is less than or equal to N/2.

* * * * *